(12) United States Patent
Willis

(10) Patent No.: US 7,045,454 B1
(45) Date of Patent: May 16, 2006

(54) CHEMICAL MECHANICAL PLANARIZATION OF CONDUCTIVE MATERIAL

(75) Inventor: Stephen L. Willis, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/552,383

(22) Filed: Apr. 19, 2000

Related U.S. Application Data

(63) Continuation-in-part of application No. 09/309,460, filed on May 11, 1999, now abandoned.

(51) Int. Cl.
*H01L 21/4763* (2006.01)

(52) U.S. Cl. ............... 438/633; 438/634; 438/636; 438/637

(58) Field of Classification Search ........... 438/743, 438/744, 692–693, 698, 760, 959, 970, 745, 438/754, 756–757, 629, 633, 634, 637, 672, 438/675, 636
See application file for complete search history.

(56) References Cited

U.S. PATENT DOCUMENTS

| | | | |
|---|---|---|---|
| 5,069,002 A * | 12/1991 | Sandhu et al. ............... 216/38 |
| 5,225,034 A | 7/1993 | Yu et al. | |
| 5,234,540 A | 8/1993 | Grant et al. | |
| 5,240,522 A | 8/1993 | Tanaka et al. | |
| 5,242,524 A | 9/1993 | Leach et al. | |
| 5,314,843 A | 5/1994 | Yu et al. | |
| 5,376,483 A | 12/1994 | Rolfson | |
| 5,407,526 A | 4/1995 | Danielson et al. | |
| 5,413,941 A | 5/1995 | Koos et al. | |
| 5,439,553 A | 8/1995 | Grant et al. | |
| 5,576,126 A | 11/1996 | Rolfson | |
| 5,637,185 A | 6/1997 | Murarka et al. | |
| 5,685,951 A | 11/1997 | Torek et al. | |
| 5,741,626 A * | 4/1998 | Jain et al. ............... 430/314 |

(Continued)

OTHER PUBLICATIONS

Wolf et al. ,Silicon Processing for the VLSI Era, vol. 1: Process Technology, Lattice Press, 1986, pp. 189-191.*

*Primary Examiner*—Jerome Jackson
*Assistant Examiner*—José R. Diaz
(74) *Attorney, Agent, or Firm*—Knobbe, Martens, Olson & Bear, LLP

(57) ABSTRACT

A process of removing excess conductive material from the exposed surface of a dielectric layer, the process comprising the steps of forming a shield layer on the dielectric layer, forming a sacrificial layer on top of the shield layer, depositing the conductive material on top of the sacrificial layer so that the conductive material is positioned within cavities in the dielectric material, and then using chemical mechanical planarization to remove the excess conductive material and the sacrificial layer. The use of a sacrificial layer interposed between the shield layer and the excess conductive material allows for chemical mechanical planarization to fully remove the sacrificial layer to facilitate more uniform removal of excess conductive material. Moreover, the shield layer is preferably formed of a material selected to be resistant to removal by CMP, such that when the sacrificial layer is removed, an end point can be detected which is indicating that the chemical mechanical planarization is now occurring at the CMP resistant shield layer to thereby result in the halting of the chemical mechanical planarization process at the shield layer. In this way, thinning of the underlying dielectric material during the chemical mechanical planarization step can be reduced.

13 Claims, 9 Drawing Sheets

U.S. PATENT DOCUMENTS

| | | | |
|---|---|---|---|
| 5,763,306 A * | 6/1998 | Tsai | 438/255 |
| 5,783,495 A | 7/1998 | Li et al. | |
| 6,037,213 A * | 3/2000 | Shih et al. | 438/253 |
| 6,103,456 A * | 8/2000 | Tobben et al. | 430/317 |
| 6,107,191 A * | 8/2000 | Han | 438/637 |
| 6,160,314 A * | 12/2000 | Lee et al. | 257/752 |
| 6,200,875 B1 * | 3/2001 | Jang et al. | 438/396 |
| 6,249,019 B1 * | 6/2001 | Sandhu et al. | 257/309 |
| 6,268,291 B1 * | 7/2001 | Andricacos et al. | 438/694 |
| 6,281,127 B1 * | 8/2001 | Shue | 438/691 |
| 6,576,553 B1 * | 6/2003 | Willis | 438/692 |
| 2001/0014498 A1 * | 8/2001 | Amico et al. | 438/243 |
| 2002/0092763 A1 * | 7/2002 | Denning et al. | 204/192.17 |

* cited by examiner

CHEMICAL MECHANICAL PLANARIZATION OF CONDUCTIVE MATERIAL

This application is a continuation-in-part application of U.S. application Ser. No. 09/309,460, filed May 11, 1999, ABN entitled CHEMICAL MECHANICAL PLANARIZATION OF CONDUCTIVE MATERIAL.

BACKGROUND OF THE INVENTION

1. Field of the Invention

The present invention relates to semiconductor processing technology and, in particular, concerns a method of planarizing the surface of a wafer using chemical mechanical polishing.

2. Description of the Related Art

Integrated circuits are typically comprised of a plurality of semiconductor devices formed in or on a semiconductor substrate. In current applications, integrated circuits can consist of literally thousands or millions of individual semiconductor devices formed in or on the substrate. Typically, large number of integrated circuits are formed on a single wafer by selectively exposing regions of the wafer so as to allow for deposition or implantation of impurities into the semiconductor wafer to thereby alter the characteristics of the semiconductor wafer to produce the desired different semiconductor devices. The semiconductor devices can be formed in the exposed regions of the wafer using well-known masking techniques in conjunction with well-known diffusion, implantation or deposition techniques.

Over the past several decades, the scale of integration of integrated circuits has increased. More particularly, semiconductor device fabrication techniques have been developed which allow for a higher density of semiconductor devices to be formed in the integrated circuits. As the scale of integration has increased and as the size of the individual semiconductor devices has decreased, it has become more important that integrated circuit designers and fabricators consider the structural integrity of the deposited devices and of the integrated circuit as a whole.

Repeated deposition of materials into the exposed regions of the wafer can result in the integrated circuit having a non-planar upper surface. As the upper surface of the integrated surface becomes less planar, the ability to form additional semiconductor devices on the integrated circuits becomes more difficult. Moreover, the existence of protrusions in the topography of the integrated circuit affects the structural integrity of the integrated circuit and can result in short circuits or failures. Consequently, integrated circuit designers and fabricators have increasingly used planarization techniques to planarize the upper surface of the integrated circuits.

One particular planarization technique is known as chemical mechanical polishing or planarization (CMP). CMP is a technique whereby the upper surface of a wafer is globally planarized by simultaneously abrasively polishing and etching the upper surface of the wafer. Basically, the wafer is positioned adjacent a pad that is rotated with respect to the wafer and the pad also contains a slurry which typically is comprised of an etchant liquid and an abrasive encapsulated within a suspension material. The rotating pad is then applied to the wafer so that protrusions in the surface topography of the integrated circuits on the wafer can be removed by a combination of abrasive polishing and etching.

One particular application where CMP has found great use is in removing protrusion in the surface topography extending above intermediate dielectric layers of an integrated circuit. Oftentimes, dielectric layers, such as BPSG Oxide (Boro-Phospho-Silicate Glass) is formed on the upper surface of a wafer so as to provide isolation or a dielectric between conductive layers and semiconductor devices formed in the wafer. After formation of the intermediate dielectric layer, cavities, such as trenches or vias, are often formed in the intermediate dielectric layer so that conductors can be deposited within the trenches or vias to allow for selective interconnection to the semiconductor devices within the semiconductor substrate or to circuit nodes positioned under the dielectric layer.

Typically, the conductive layers are formed by depositing conductive material such as Polysilicon, Tungsten, or Aluminum, on top of the intermediate dielectric layer using well-known deposition techniques, such as vacuum chamber deposition, spluttering and the like. While the deposition techniques will result in conductive material being deposited within the trenches and vias formed in the intermediate dielectric layer, a substantial portion of the conductive material will extend upward from the intermediate dielectric layer thereby resulting in less planarization of the upper surface of the integrated circuit.

To address this problem, CMP is often used to remove the excess portion of the conductive material that is positioned on top of the intermediate dielectric layer as a result of the deposition techniques. While CMP is well adapted for removing the excess conductive material, it is often difficult to control the rate of removal of the conductive material which can result in portions of the intermediate dielectric layer being inadvertently removed during the CMP process.

Hence, there is often a difficulty associated with thinning of the intermediate dielectric layer during the planarization and removal of excess conductive material step. As device integration on integrated circuits has increased, the tolerances of the required thicknesses for intermediate dielectric layers have become smaller. Consequently, this thinning of the dielectric layers during chemical mechanical planarization has become of greater concern in integrated circuit fabrication.

Hence, there is a need for a process whereby planarization of intermediate dielectric layers can be achieved which reduces inadvertent thinning of the dielectric layer during the planarization process. To this end, there is a need for a planarization technique, such as CMP, which is capable of planarizing a dielectric or Oxide layer to remove excess conductive material, but does not result in significant thinning of the underlying region or layer.

SUMMARY OF THE INVENTION

The aforementioned needs are satisfied by one aspect of the present invention which is a method of forming a circuit element on a semiconductor wafer comprising forming a dielectric layer on a semiconductor wafer, forming a shield layer on the dielectric layer, forming a first cavity in the dielectric layer, and then depositing conductive material on the wafer so that the conductive material coats the exposed surfaces of the first cavity and so that the conductive material does not completely fill the cavity so as to define a second cavity within the first cavity. The method further comprises removing excess conductive material by chemical mechanical planarization (CMP), wherein the shield layer inhibits thinning of the dielectric layer during the chemical mechanical planarization. In this way, substantially all of the excess conductive material can be removed while reducing the degree of thinning of the underlying dielectric layer.

In one embodiment, the step of removing the excess conductive material includes detecting an end point which corresponds to the chemical mechanical polishing of the shield layer. In this way, chemical mechanical polishing of the excess conductive material and can be continued until an indication that the chemical mechanical polishing is now occurring at the shield layer.

In another aspect of the invention, a method of forming a conductive element in a dielectric layer on a semiconductor wafer is provided. The method includes positioning a shield layer on the dielectric layer, positioning a sacrificial layer on the shield layer, forming a cavity in the dielectric layer, and depositing conductive material on the sacrificial layer so that the conductive layer is positioned within the cavity. The method further includes using chemical mechanical polishing (CMP) to remove the excess conductive material and the sacrificial layer, wherein the CMP is performed using an etchant selected to remove the sacrificial layer and wherein the shield layer is resistant to the selected etchant.

In another aspect of the invention a method of forming a dielectric layer of a first thickness on a semiconductor wafer is provided. The method comprises forming the dielectric layer of the first thickness on the wafer, positioning a shield layer on the dielectric layer, positioning a sacrificial layer on the shield layer, depositing conductive material on the sacrificial layer, and removing the conductive material and the sacrificial layer using a chemical mechanical polishing process adapted to remove the conductive material and the sacrificial layer wherein the shield layer is more resistant to planarization by the chemical mechanical polishing process than the sacrificial layer. The method further comprises detecting when the chemical mechanical polishing process has removed the sacrificial layer.

In another aspect of the invention, an electrical structure formed using semiconductor processing techniques is provided. The electrical structure comprises a circuit node, a layer of dielectric material formed over the circuit node to a desired thickness and having an opening formed therein, a shield layer formed on an outer surface of the dielectric layer, and a sacrificial layer formed on an outer surface of the shield layer. The electrical structure further comprises a conductive plug formed of a conductive material positioned within the opening so as to contact the circuit node, wherein the shield layer provides a shield against thinning of the dielectric layer from the desired thickness and wherein the sacrificial layer facilitates CMP removal of excess conductive material during formation of the conductive plug.

In another aspect of the invention, a capacitor structure formed using semiconductor processing techniques is provided. The capacitor structure comprises a layer of dielectric material formed to a desired thickness and having an opening formed therein, a shield layer formed on an outer surface of the dielectric layer, and a bottom electrode formed of a conductive material positioned within the opening so as to be adjacent the dielectric layer, wherein the shield layer provides a shield against thinning of the dielectric layer from the desired thickness during formation of the bottom electrode. The capacitor structure further comprises a capacitor dielectric formed on an outer surface of the bottom electrode within the opening, and an upper electrode formed of a conductive material on an outer surface of the capacitor dielectric.

From the foregoing, it will be appreciated that the process of the present invention allows for removal of excess conductive material in a manner that reduces the degree of thinning of the underlying intermediate dielectric layer. These and other objects and advantages of the present invention will become more apparent from the following description taken in conjunction with the accompanying drawings.

DETAILED DESCRIPTION OF THE PREFERRED EMBODIMENTS

Reference will now be made to the drawings wherein like numerals refer to like parts throughout. One embodiment of the present invention will initially be described in relation to the schematic illustrations of FIGS. 1A–1F which illustrate the process by which a cavity, such as a trench, via or other opening, is formed in a dielectric layer, such as an intermediate dielectric layer. Subsequent to the formation of the intermediate dielectric layer, a conductive material, such as Polysilicon or a metal, is deposited on the upper surface of the dielectric layer so as to fill the cavity in the dielectric layer. As will be discussed in greater detail below, the dielectric layer includes a sacrificial layer and a shield layer that will allow for better removal of the excess conductive material from the upper surface of the dielectric layer while reducing the degree of thinning of the dielectric layer during the removal and planarization process.

Figure 1A:
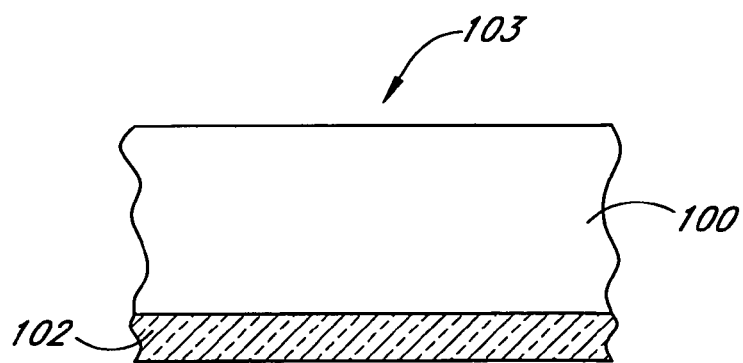
FIGS. 1A–1F are sectional views illustrating the process by which a cavity is formed in a dielectric layer and conductive material is deposited on the surface of the device so as to fill the cavity with the excess conductive material being removed through one embodiment of a CMP process.
Figure 1B:
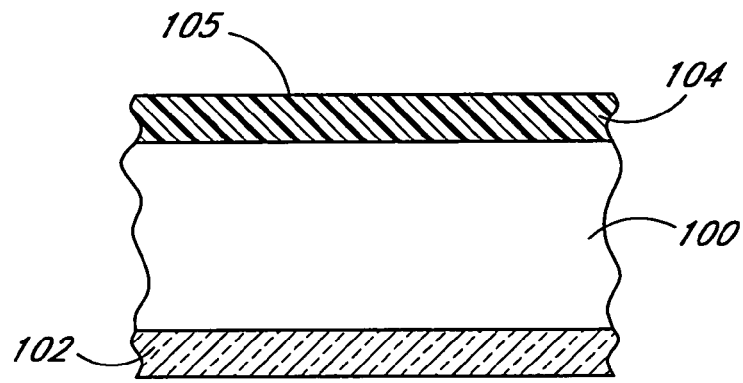

Specifically referring to FIG. 1A, a dielectric layer 100 is provided. The dielectric layer 100 can be comprised of a dielectric layer that is positioned on top of a semiconductor substrate 102 so as to isolate conductors from semiconductor devices formed in the underlying substrate 102. Alternatively, the dielectric layer 100 can also be formed to separate devices and conductors formed on top of the substrate 102. The exact configuration of the dielectric layer 100 can, of course, vary depending upon the design and configuration of the semiconductor device. In one embodiment, the intermediate dielectric layer 100 is comprised of a layer of BPSG Oxide that is grown to a desired thickness using well-known techniques on top of the semiconductor substrate 102. However, it will be appreciated that any of a number of well-known dielectric layers or spacer layers, such as TEOS layers etc., can be used in conjunction with this process as will be described in greater detail below.

Subsequent to the positioning of the dielectric layer 100 on the substrate 102, a shield layer 104 is then positioned on an upper surface 103 of the dielectric layer 100. As will be discussed in greater detail below, the shield layer 104, in one embodiment, is selected to be resistant to a subsequent chemical mechanical planarization (CMP) process. In one embodiment, the shield layer 104 is comprised of a layer of material that has a relatively high hardness when compared to other Oxide layers or is comprised of other hard Oxide layers, such as TEOS Oxide, and the like. In another embodiment, the shield layer 104 is selected so that it is relatively impervious to the etchant that will be used in a subsequent chemical mechanical planarization (CMP) process. In one embodiment, the shield layer 104 is formed by depositing Silicon Nitride ($Si_3N_4$) in a well known manner on the upper surface 103 of the dielectric 102. The Silicon Nitride shield layer 104 is less susceptible to removal in certain CMP processes depending upon the etchant used in the process.

In yet another embodiment, the shield layer 104 may comprise material that reflects a relatively small amount of light from its surface. In particular, the shield layer 104 may comprise an antireflective coating, such as dielectric antireflective coating (commonly known as DARC Oxide) having the chemical composition of $SiO_xN_y$, wherein x and y are integer values. Furthermore, the DARC shield layer 104 may be deposited using a Chemical Vapor Deposition (CVD) process, such as plasma enhanced CVD. Thus, as will be described in greater detail below in connection with FIG. 2B, the DARC Oxide shield layer provides improved end point determination in light monitoring CMP systems.

Figure 1C:
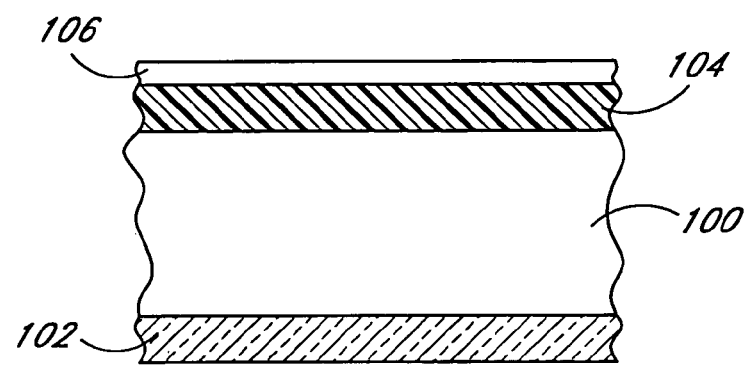

Subsequently, as shown in FIG. 1C, a sacrificial layer 106 is deposited on an upper surface 105 of the shield layer 104. In this embodiment, the sacrificial layer 106 is comprised of a sacrificial Oxide, such as BPSG Oxide, which is grown to a thickness of 200–1000 angstroms. As will be described in greater detail below, the sacrificial layer is selected so as to be more easily removed during planarization than the shield layer 104.

Figure 1D:
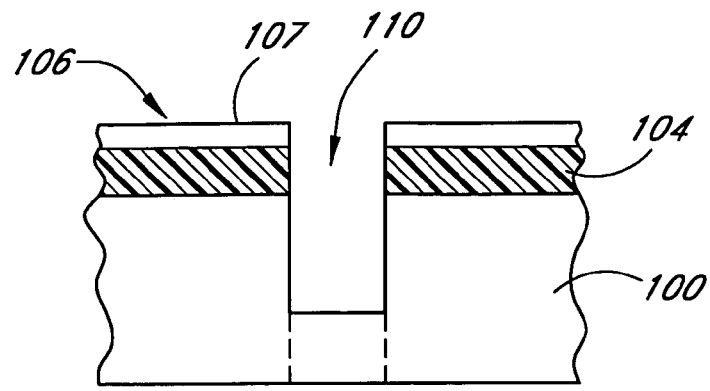

As is shown in FIG. 1D, a cavity 110 is formed so as to extend through the sacrificial layer 106, the shield layer 104 and into the dielectric layer 100. The cavity 110 is preferably formed using well known patterning and etching processes. As will be understood, the cavity 110 can comprise an opening, via or trench that is adapted to receive conductive material in a manner that will be described in greater detail below. The cavity 110 may extend entirely through the dielectric layer 100 to the underlying devices or it may simply extend only partially into the dielectric layer 100 so that any conductive material positioned within the cavity 110 is insulated from any semiconductor devices or other conductors positioned on the other side of the dielectric layer 100. It will be appreciated that the cavity 110 may take the form of a trench, whereby a conductive trace can be deposited in the dielectric layer 100 and extend across the surface of the integrated circuit while still allowing the upper surface of the circuit to be generally planar as will be described in greater detail below.

Figure 1E:
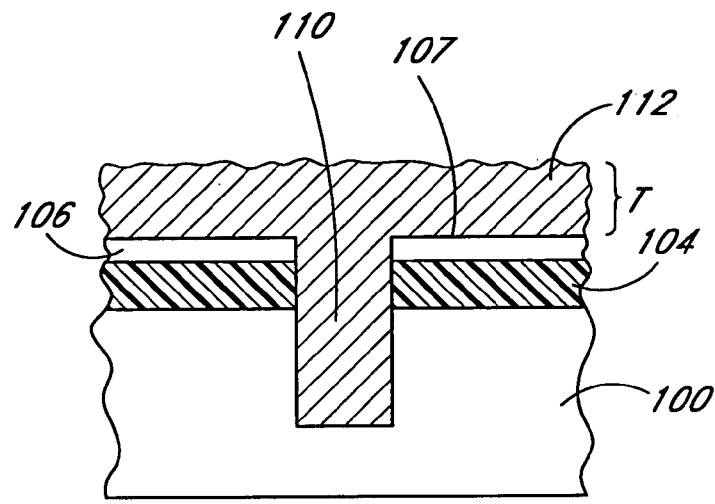

As is shown in FIG. 1E, a conductive material 112, such as Polysilicon, Aluminum, Tungsten, Tungsten Nitride, or Copper, can be deposited on the upper surface 107 of the sacrificial layer so that the conductive material 112 fills the cavity 110. The conductive material 112 is generally deposited on the upper surface 107 of the sacrificial layer 106 and within the cavity 110 using well-known deposition techniques, such as vacuum deposition, spluttering and the like. As is shown in FIG. 1E, the deposition usually results in the conductive material 112 extending an irregular thickness T from the upper surface 107 of the sacrificial layer 106. This is typically the result of the deposition process whereby excess material builds up on the upper surface 107 of the sacrificial layer 106 while the cavity 110 is being filled with the conductive material 112 in a desired fashion. This excess thickness T of the conductive material can result in individual conductors of the integrated circuit touching one another and further results in a thicker, less planar, integrated circuit. Consequently, it is desirable to remove the excess thickness T of the conductive material 112 so that only the portion of the conductive material 112 deposited within the cavity 110 remains at the end of the process.

Figure 1F:
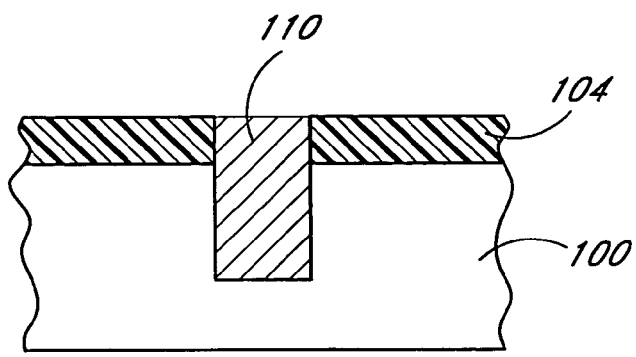

In this embodiment, chemical mechanical polishing or planarization (CMP) is used so as to remove the excess thickness T of the conductive material 112 positioned on the upper surface 107 of the sacrificial layer 106. As is also shown in FIG. 1F, the CMP process results in the removal of the excess conductive material 112 that is positioned on top of the upper surface of the sacrificial layer 106 and also the sacrificial layer 106. In particular, the CMP process is preferably performed so that all of the sacrificial layer 106 is removed and so that the CMP process is terminated against the shield layer 104. As discussed above, the shield layer 104 is selected to be less easily removed through the CMP process than either the conductive material 112 or the sacrificial layer 106. In one embodiment, the shield layer 104 is of significantly greater hardness than the sacrificial layer 106. In another embodiment, the etchant used in the CMP process is selected to remove the conductive material 112 and the sacrificial layer 106, but the shield layer 104 is selected to be relatively impervious to the etchant.

Consequently, the current that is drawn by the motor to turn the polisher will increase as the polisher comes in contact with the shield layer 104. By terminating the CMP process at that point, it will ensure that substantially all of the sacrificial layer 106 has been removed. If substantially all of the sacrificial layer 106 has been removed, the likelihood of excess conductive material 112 positioned on the upper surface 105 of the shield layer 104 remaining after the CMP process step is reduced. In this way, the conductive material 112 can be removed from the upper surface of the dielectric layer 100 without contributing to excess thinning of the dielectric layer 100. Moreover, due to the differences in CMP removal rates between the shield layer 104 and the sacrificial layer 106, the shield layer 104 can be used to define an end point to the CMP process.

Figure 2A:
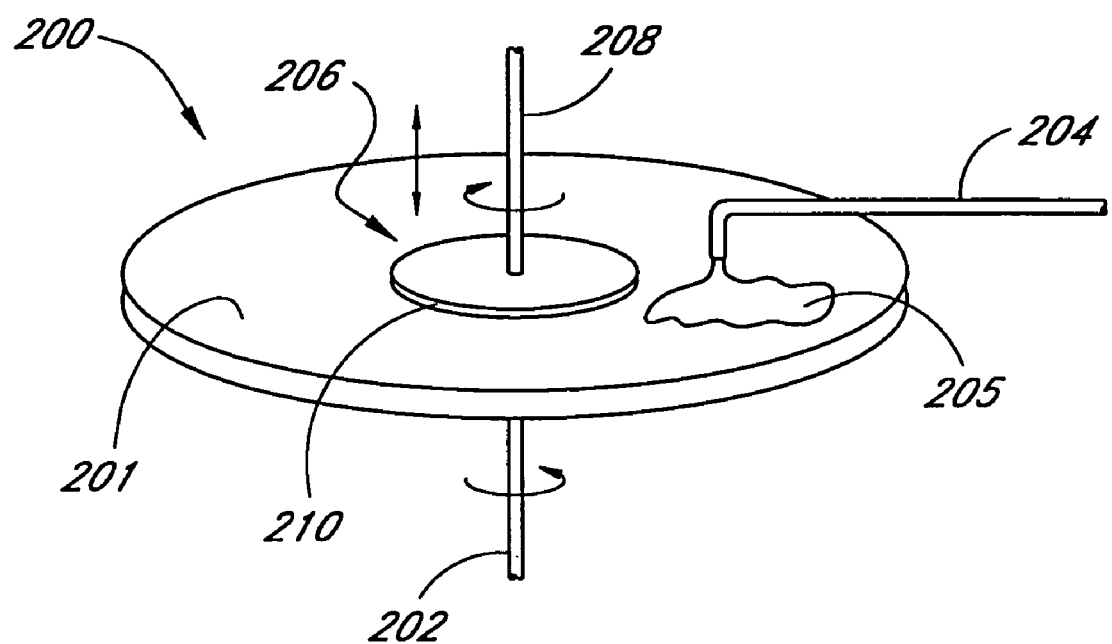
FIG. 2A is a schematic illustration of an exemplary CMP device which is used to remove extra conductive material formed on the upper surface of the dielectric layer so as to planarize the structure.

More specifically, FIG. 2A schematically illustrates a manner in which CMP is often performed on a semiconductor wafer. As shown in FIG. 2A, a typical CMP system 200 includes a rotating polishing pad or surface 201 that is rotated by a shaft 202 attached to a motor (not shown). The polishing pad 201 may comprise a relatively soft material, such as a plastic like polyurethane, and a slurry 205 is provided by a supply tube 204 to the pad while the pad is rotated. The slurry 205 provided by the tube 204 is typically comprised of an abrasive material, such as alumina or silica particles, that is encapsulated within an etchant liquid and also, possibly, a suspension fluid. The exact compensation of the slurry 205 will, of course, vary depending upon the material that is to be removed from the wafer via the CMP process.

In one embodiment, the etchant in the slurry 205 is selected to be a Corundum-type etchant available from Rodel, Newark, Del., that is specifically adapted for etching BPSG Oxide and Polysilicon conductive material. In this embodiment, the shield layer 104 is comprised of a Silicon Nitride ($Si_3N_4$) material that is relatively impervious to the corundum etching. The slurry can therefore be selected for selective etching action against the conductive material 110 and the sacrificial material 106 but is relatively ineffective at etching the underlying shield layer 104 to facilitate end point definition as will be described in greater detail hereinbelow.

The CMP system 200 also includes a rotatable wafer carrier 206 that is rotatable about a shaft 208 by a motor (not shown). The wafer 210 is attached to the carrier 206 so that the wafer 210 can be positioned against the polishing pad 201 in the manner shown in FIG. 2. The wafer carrier 206 and the polishing pad 201 are moveable with respect to each other so that the plane of the polishing pad 201 can be positioned against the plane of the wafer 210 that is positioned within the carrier 206. When the wafer 210 is positioned proximate the polishing pad 201, the surface of the wafer 210 adjacent the polishing pad 201 is preferably planarized by the combination of the abrasive polishing the surface of the wafer 210 and the etchant of the slurry 205 chemically interacting with the materials on the exposed surface of the wafer 210.

As is understood in the art, as the pad 201 begins to planarize materials of different hardness, various detectable end points are used which can be used to control the CMP process. Similarly, if the slurry 205 is selected for removal of the excess conductive material 110 and the sacrificial layer 106 but does not etch the shield layer 104 as effectively, various detectable end points also occur. As is understood in the art, there are various ways of detecting the end point of a CMP process. One way of detecting end point is to simply observe the current that is being drawn by the motors rotating the pad and the wafer.

In particular, as the pad 201 removes the excess conductive material 110 and the sacrificial layer 106, the pad then comes in contact with the shield layer 104. As the shield layer 104 is not removed as easily as the sacrificial layer 106 or the conductive material 110, either as a result of different hardness or different etchant rates between the materials, the frictional engagement between the polishing pad 201 and the shield layer 104 increases during the CMP process. As a result of the increase in the frictional engagement, the amount of current drawn by the motor that is causing either the carrier 206 or the pad 201 or both to rotate increases. Hence, by monitoring the current draw by either or both of these motors, an end point can be detected which is indicative of the CMP process having removed all of the excess conductive material 110 and the sacrificial layer 106. It will be appreciated that the use of the current drawn by a rotating motor of a chemical mechanical polishing system provides a well-known end point suitable for use for halting a chemical mechanical polishing process.

Moreover, it will also be appreciated that any of a number of end point determinations can be used to assess when the CMP process has removed the excess conductive layer 110 and the sacrificial layer 106 and is in contact with the shield layer 104 to halt the CMP process in a manner that reduces the thinning of the dielectric layer 100. For example, another way of detecting end points is by exposing the surface of the wafer that is subject to the CMP process to a light source, such as a LASER, and then analyzing the intensity of the reflected light. The light source can be tuned so that the intensity of the reflected light changes, e.g., decreases, when the CMP process has exposed the shield layer. Thus, it will be appreciated that any of a number of CMP end point detection schemes can be used with the shield layer of the present invention without departing from the spirit of the present invention.

It will also be appreciated that, while a preferred embodiment is described in connection with a CMP system that incorporates a rotating carriage 206 and pad 201, the present invention should not be limited to only these types of CMP systems. In fact, any CMP system which incorporates translational movement between a pad and a wafer so as to remove portions of the wafer can utilize the present invention as claimed herein.

Figure 2B:
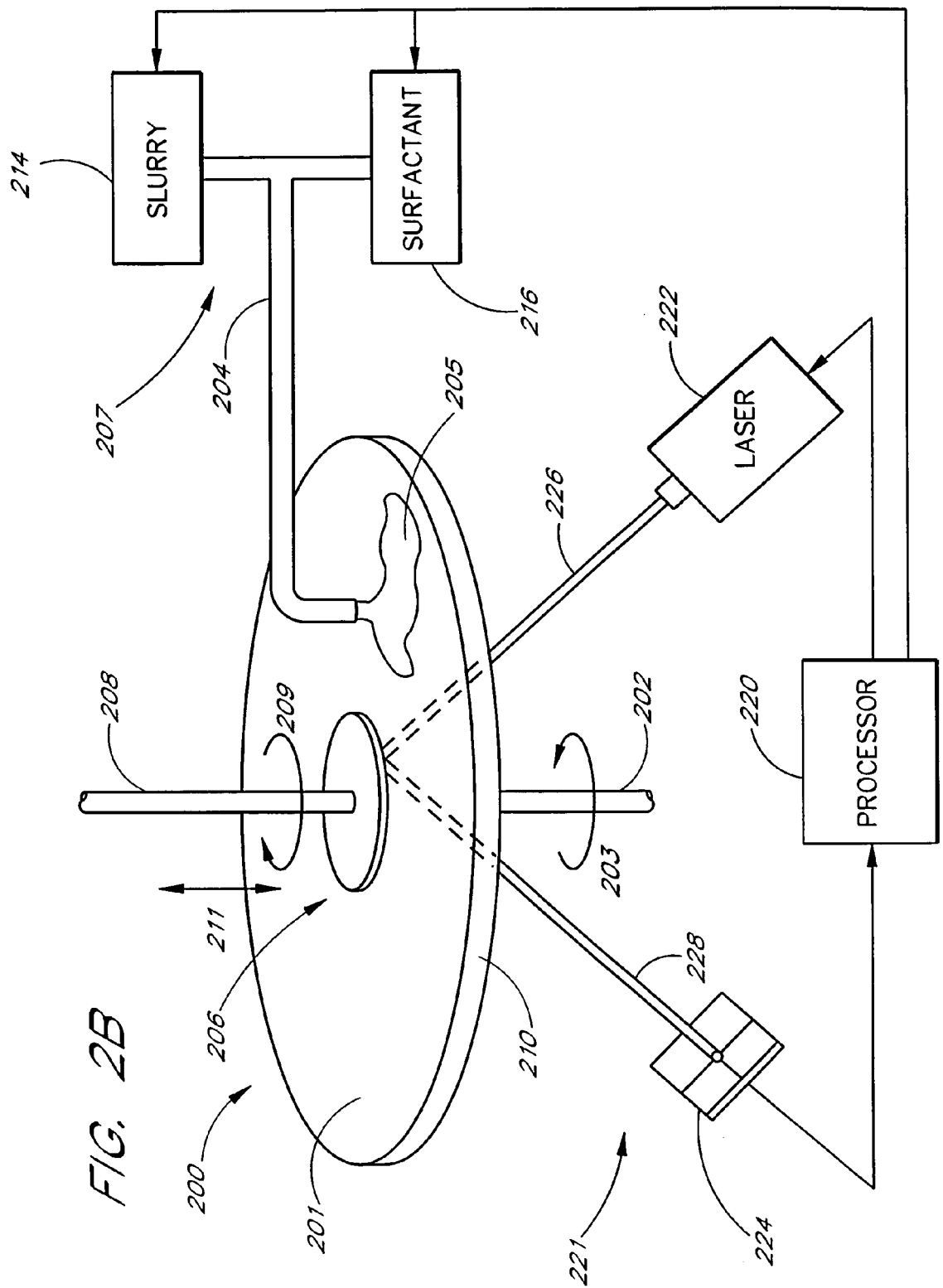
FIG. 2B is a schematic illustration of another exemplary CMP device which is used to remove extra conductive material formed on the upper surface of the dielectric layer so as to planarize the structure.

FIG. 2B is a schematic illustration of one embodiment of the CMP system 200 that monitors reflected light to perform end point determination. In this embodiment, the CMP system 200 further comprises a processor or processing system 220 that is adapted to control the CMP process performed by the system 200. In particular, the processor 220 is capable of translating the pad 201 and the carriage 206 with respect to each other and then positioning the pad 201 and the carriage 206 in proximity to each other to begin the planarization process. The processor 220 also receives end point data from an end point detection system 221 and decides, based upon the end point data, when the end of the planarization process has occurred.

In this particular embodiment, the end point detection system 221 is comprised of one or more light sources 222, such as a laser, that shine a beam 226 through the pad 201 onto the surface of the wafer 210 and a detector 224 that receives a reflective beam 228 from the surface of the wafer and provides a signal indicative thereof to the processor 220.

The light source 222 is adapted to produce the beam 226 that is selected so that the reflective beam 228 is modulated in a detectable manner upon the planarization of the wafer 210 occurring such that a particular layer of the wafer is exposed. In one embodiment, the light source 222 is comprised of a laser that produces the beam 226 of a particular wavelength that is selected so that the intensity of the reflected beam 228 decreases upon the planarization of the wafer 210 occurring such that a particular layer of the wafer is exposed. The occurrence of a relatively large decrease in intensity of the reflected beam 228 is indicative of the end point of the CMP process. Upon receiving such a signal from the detector 224, the processor 220 is adapted to halt the CMP process.

The system illustrated in FIG. 2B is an exemplary CMP system of a type that is well known in the art. Examples of such a system include the MIRRA Chemical Mechanical Planarization System available from Applied Materials of Santa Clara, Calif.

Figure 3:
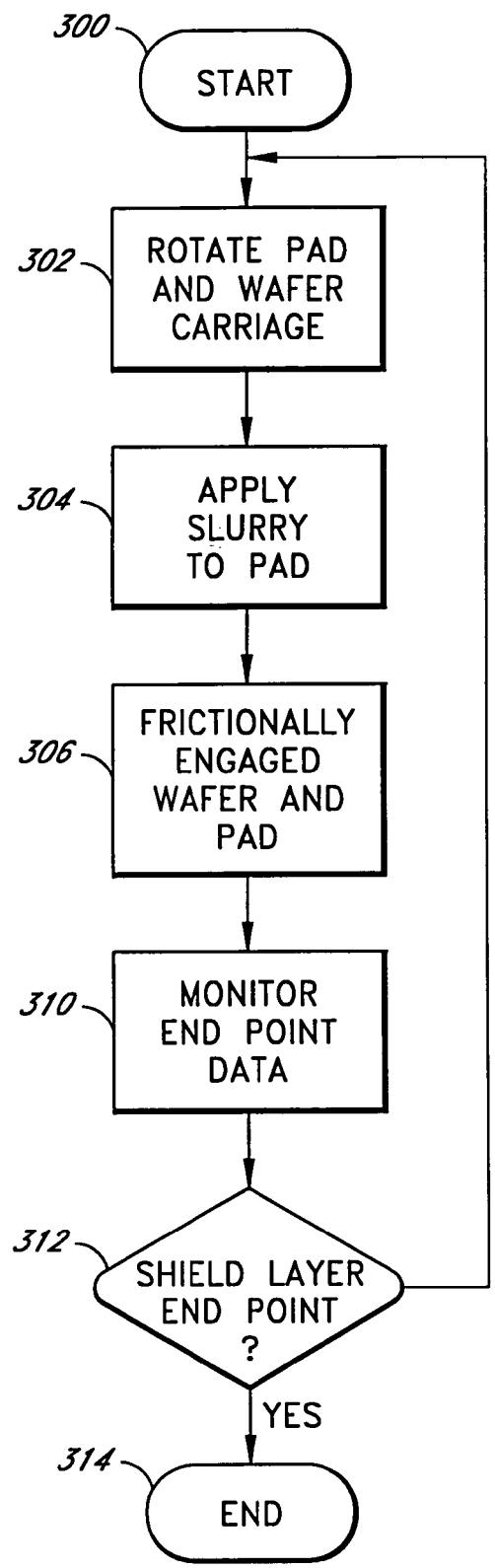
FIG. 3 is a flow chart illustrating the basic operation of the chemical mechanical polishing device of FIG. 2 as excess conductive material is removed from the upper surface of the structure shown in FIGS. 1A–1F.

FIG. 3 is a flow chart which illustrates the general operation of the CMP systems 200 as the excess conductive material 110 and the sacrificial layer 106 is removed from the wafer 210. In particular, the CMP system 200 from a start state 300, initially rotates the polishing pad 201 and the wafer carriage 206, in a state 302. In the preferred embodiment, the CMP system 200 is adapted to rotate the pad 201 and the carriage 206 simultaneously in opposite directions. However, it will be appreciated that in some CMP systems, only the carriage or the pad may be rotated in order to achieve the planarization effect and that the CMP process of the present invention can be used with these types of CMP systems without departing from the spirit of the present invention. Furthermore, in some CMP systems, relative movement between the carriage and the pad could occur in either a continuous or reciprocal manner. Moreover, in some CMP systems, relative movement could occur in a translational manner.

Once the rotational movement between the wafer 210 and the pad 201 has been established, slurry 205 is applied to the pad 201 in state 304 via the slurry supply tube 204. After the slurry 205 has been supplied, the pad 201 is frictionally engaged with the wafer 210. In the preferred embodiment, the wafer carriage 206 and the pad 201 are moved with respect to each other such that the plane of the exposed surface of the wafer 210 is brought into physical contact with the pad 201. The rotational movement between the pad 201 and the wafer 210 provides the frictional engagement which results in the abrasive captured within the slurry 205 removing portions of the exposed surface of the wafer 210 and also allowing the etchant within the slurry 205 to chemically react with the exposed surface of the wafer to further enhance the removal and planarization process.

At this point, in the embodiment of FIG. 2A, the CMP system 200 is monitoring end point data in a state 310 which are indicative of the frictional forces applied between the pad and the wafer. As discussed above, the end point data in one embodiment is the current that is being drawn by the motors that is establishing the rotational movement between the pad 201 and the exposed surface of the wafer 210. Preferably, in this embodiment, the CMP system 200 includes a processor that can be adapted to receive an end point signal indicative of the current being drawn by the motor so that when the current has increased to thereby indicate that the pad 201 is now in contact with the shield layer 104, the processor can halt the chemical mechanical polishing step.

Alternatively, in the embodiment of FIG. 2B, the CMP system 200 is monitoring end point data in the state 310 which are indicative of the light 228 reflected from the surface of the wafer 210. As discussed above, the end point data in this embodiment are the output signals of the light sensors 224 which are indicative of the light energy entering the active regions of the sensors 224. Furthermore, in this embodiment, the CMP system 200 includes the processor 220 that is adapted to receive the output signals from the light sensors 224 so that when the output signals change to thereby indicate that the pad 201 is now in contact with the shield layer 104, the processor 220 can halt the chemical mechanical polishing step.

Hence, the CMP system 200 determines, in decision state 312, whether the shield layer end point has been detected. If the shield layer end point has not been detected in decision state 312, the process returns to state 302 where the rotational motion between the pad 201 and the wafer 210 is maintained. If, however, the end point is detected in decision state 312, the process is then terminated in an end state 314.

From the foregoing discussion, it will be appreciated that the method of removing conductive material from an exposed surface of a dielectric layer can result in more complete removal of the conductive material while reducing the degree of thinning of the underlying dielectric layer as a result of the chemical mechanical polishing. This allows the dielectric layer to be grown to a final thickness of a more exact tolerance. Moreover, in one embodiment, the use of a CMP resistant shield layer 104 immediately underneath the sacrificial layer results in the establishment of a readily identifiable end point for the CMP system 200. Furthermore, in another embodiment, the use of an antireflective shield layer 104 immediately underneath the sacrificial layer results in the establishment of a readily identifiable end point for the CMP system 200. Moreover, the CMP resistant shield layer 104 is also more resistant to chemical mechanical planarization such that the inadvertent removal of the shield layer 104 is reduced as compared to removal of the material forming the dielectric layer 100 in a similar prior art CMP process.

Figure 4:
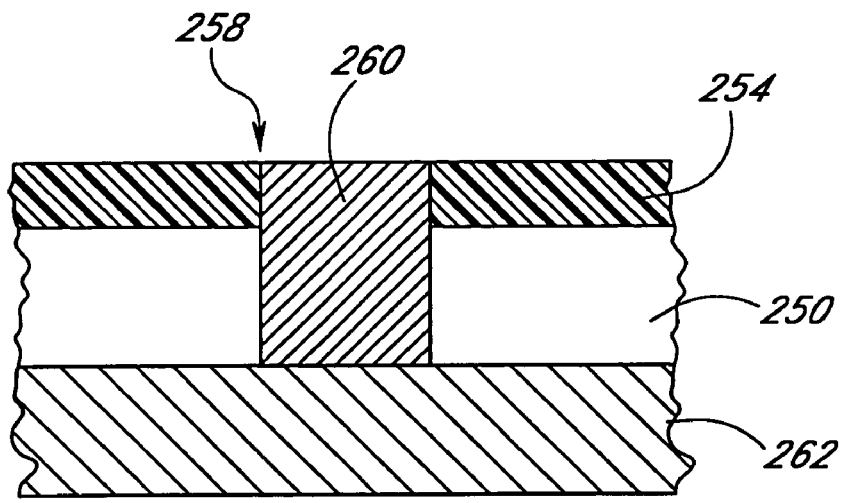
FIG. 4 is a sectional view illustrating a contact plug having a shield layer to reduce thinning of a dielectric layer during chemical mechanical planarization of the upper surface of the dielectric layer.

Reference will now be made to FIG. 4 which illustrates an exemplary structure that can be formed using the process described above in conjunction with FIGS. 1A through 1F. In particular, FIG. 4 shows a contact plug 260 that is formed in an opening 258 in a dielectric layer 250 that has been grown to a desired thickness on top of a circuit node 262, which in one embodiment, can be a semiconductor substrate. The contact plug 260 is preferably formed of a conductive material such as Polysilicon, Tungsten and the like so that electrical connection can be made to the circuit node 262 positioned underneath. The dielectric layer 250 is formed of a dielectric isolating material, such as BPSG Silicon to a desired thickness. A shield layer 254 is positioned on top of the dielectric layer 250. The shield layer 254 can be any material that provides reliable end point determination to a CMP process that is being used to remove excess material positioned on top of the shield layer 254 during the formation of the contact plug 260 in the manner described above, such as Nitride material or DARC Oxide material.

Figure 5A:
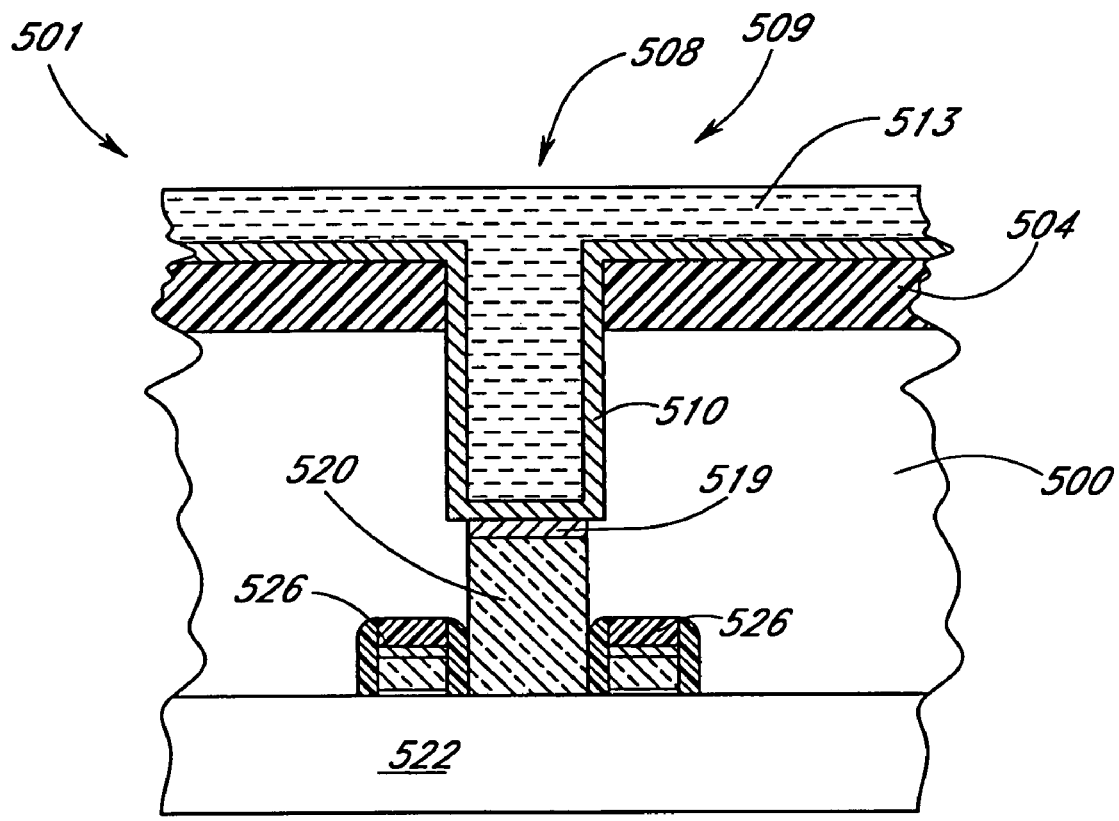
FIGS. 5A–5D are sectional views illustrating various embodiments of a method of forming a capacitor structure which utilizes a shield layer to reduce thinning of a dielectric layer during chemical mechanical planarization of the upper surface of the dielectric layer.

Reference will now be made to FIGS. 5A–5D which illustrate methods of forming a bottom electrode 510 of a capacitor structure 501, wherein the methods are similar to those described above in conjunction with FIGS. 1A–1F. As shown in FIG. 5A, a contact plug 520, such as the plug described above, is formed so as to electrically interconnect the bottom electrode 510 to a substrate 522. Furthermore, in one embodiment a barrier layer 519 is interposed between the plug 520 and the bottom electrode 510 in a well known manner so as to reduce oxidation of the plug 520 and so as to reduce Silicon diffusion of the bottom electrode 510. Typically, there is also one or more transistor gate structures 526 which allows for selective activation of the bottom electrode 510 of the capacitor structure 510 in a well known manner.

As shown in FIG. 5A, a dielectric layer 500 of a material such as BPSG Oxide is grown to a desired thickness using well-known techniques above the substrate 522. A shield layer 504 such as DARC Oxide or Nitride is then positioned on the upper surface of the dielectric layer 500. In one embodiment, a first opening 508 is formed in the shield layer 504 and the dielectric layer 500 using well known techniques so that the capacitor structure 501 can be subsequently formed within the opening 508. The bottom electrode layer 510 is then formed within the opening 508 so as to cover the interior walls of the opening 508. Furthermore, the bottom electrode layer 510 does not completely fill the opening 508 so as to define a second opening 509 within the first opening 508 and so as to enable subsequent deposition of a dielectric layer 512 and an upper electrode layer 514 within the opening 509 as will be described in greater detail below in connection with FIG. 5D.

The bottom electrode layer 510 is formed by depositing a conductive material, preferably of a barrier metal to prevent diffusion of subsequently deposited material into the dielectric isolation layer 500. The layer 510 is formed using well known techniques using materials such as Tungsten, Tungsten Nitride, Platinum, Platinum alloys, Tantalum, Ruthenium, Ruthenium Oxides such as $RuO_2$ and $Ru_2O_3$, and the like. Furthermore, the bottom electrode layer 510 may be formed with a hemispherical grained surface (HSG) so as to enhance the capacitance of the capacitor structure 501 by increasing the surface area of the layer 510. During the formation of the layer 510, excess material is often deposited on top of the shield layer 504 and is removed using CMP. As discussed above, the shield layer 504 enhances end point determination which allows for removal of the excess material while decreasing the likelihood of thinning of the underlying dielectric layer 500.

Figure 5B:
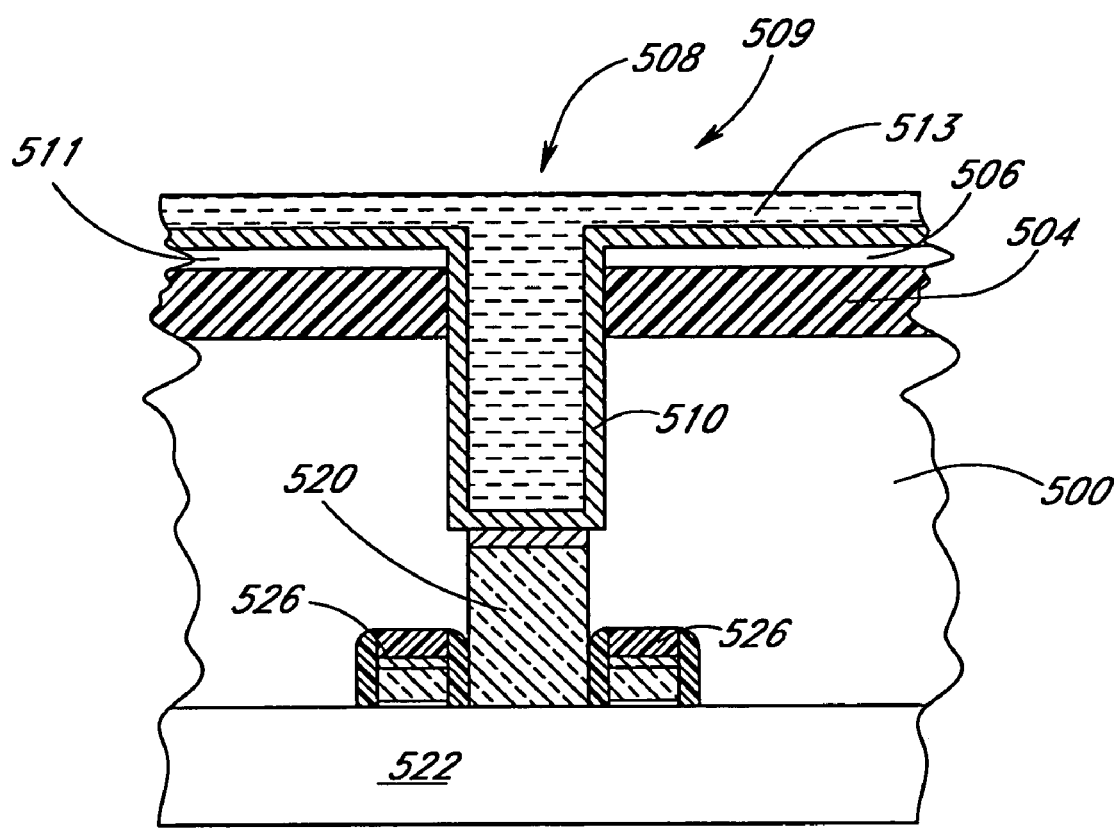

As shown in FIG. 5B, in another embodiment, a sacrificial layer 511 is deposited over the shield layer 504 before forming the opening 508. In particular, the sacrificial layer 506 is comprised of sacrificial Oxide, such as BPSG Oxide, which is grown to a thickness of 200–1000 Angstroms so as to be more easily removed during planarization than the shield layer 504. Furthermore, as described previously, the sacrificial layer 506 reduces the likelihood that overlying conductive material will remain following the CMP process.

As shown in FIGS. 5A and 5B, a temporary fill layer 513 is preferably deposited over the bottom electrode layer 510 so as to temporarily fill the second opening 509. As will be described in greater detail below, the fill layer 513 helps to maintain the integrity of the bottom electrode layer 510 during the subsequent CMP process. Furthermore, since the fill layer 513 is to be removed in a subsequent processing step, the fill layer 513 preferably comprises any material that can be removed during the previously mentioned CMP process and that can be further removed during a conventional etching process. In one embodiment, the fill layer 513 comprises photoresist.

Figure 5C:
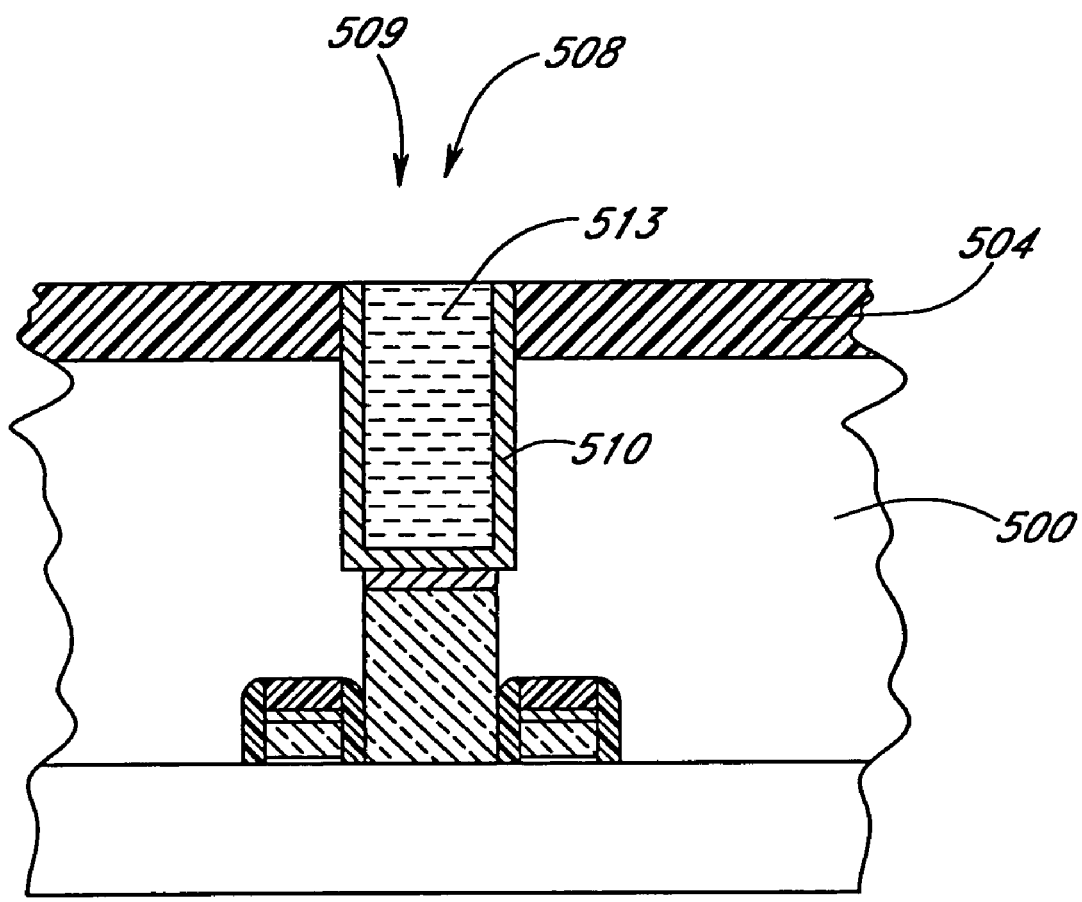

Subsequent to depositing the temporary fill layer 513 over the bottom electrode layer 510, either of the CMP processes described previously can be used to remove excess material from the fill layer 513 and excess material from the bottom electrode layer 510 so as to define the bottom electrode 510 of the capacitor structure 501 of FIG. 5C. In the embodiment of FIG. 5B, the sacrificial layer 506 is also removed during the CMP process so as to reduce the likelihood that material from the bottom electrode layer 510 remains on the upper surface of the shield layer 504 following the completion of the CMP process.

Figure 5D:
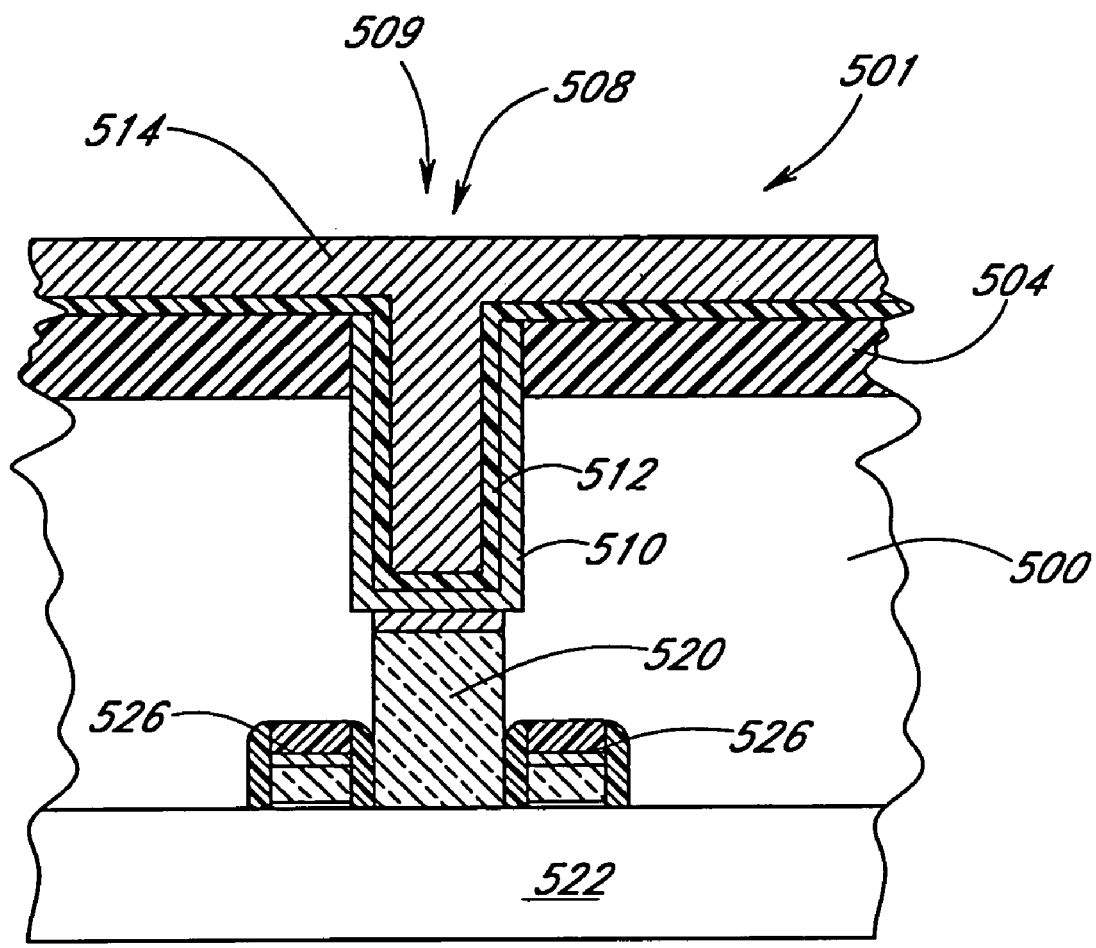

FIG. 5C illustrates an intermediate form of the capacitor structure 501 of FIG. 5D subsequent to the completion of the CMP process. As shown in FIG. 5C, the remaining material from the fill layer 513 extends into the opening 509 so as to form a planarized upper surface that aligns with the planarized upper surface of the shield layer 504. Furthermore, since the bottom electrode 510 and the fill layer 513 substantially fill the opening 508, the likelihood that the upper vertical portions of the bottom electrode 510 are dislodged from the shield layer 504 and the dielectric layer 500 during the CMP process is reduced. Consequently, the integrity of the bottom electrode 510 is substantially maintained during the CMP process.

Subsequent to the completion of the CMP process, the remaining fill layer 513 of FIG. 5C is substantially removed so as to substantially expose the bottom electrode 510 and, thus, redefine the opening 509. In one embodiment, an etching process is used to remove the remaining fill layer 513. In particular, the fill layer 513 comprising known photoresist material is exposed to a known etchant comprising an oxidizing agent.

As shown in FIG. 5D, a dielectric layer 512 is then deposited in the opening 509 using well known techniques so as to eventually form an insulating medium between the bottom electrode 510 and a top electrode 514 of the capacitor structure 501. In particular, the dielectric layer 512 is deposited so as to cover the exposed outer surface of the bottom electrode 510. Furthermore, the dielectric layer 510 is formed of a dielectric material such as Tantalum Oxide, Aluminum Oxide and Barium Strontium Titanate or other High-K dielectric materials. The upper electrode 514 is then formed on the exposed outer surface of the capacitor dielectric 512. The upper electrode 514 is typically formed of a material such as Polysilicon, Platinum, Platinum alloys, Tungsten, Tungsten Nitride, Ruthenium, Ruthenium Oxide ($RuO_2$), Iridium and Iridium Oxide ($IrO_2$).

The structures illustrated in FIGS. 4 and 5D simply illustrate two types of structures that can be formed so as to have a shield layer that improves endpoint determination during CMP removal of excess material. These structures can be formed so as to have material layers of closer tolerances which enhances the ability to form higher density structures. While FIGS. 4 and 5D illustrate two different possible structures, it will be appreciated that any of a number of different structures formed in semiconductor processing can be formed having a shield layer which protects a particular region of the device from thinning during CMP without departing from the spirit of the present invention.

Although the foregoing description of the preferred embodiments of the present invention has shown, described and pointed out the fundamental novel features of the invention, it will be understood that various omissions, substitutions and changes in the form of the detail of the apparatus as illustrated, as well as the uses thereof, may be made by those skilled in the art without departing from the spirit of the present invention. Consequently, the scope of the invention should not be limited to the foregoing discussion, but should be defined by the appended claims.

What is claimed is:

1. A method of forming a dielectric layer of a first thickness on a semiconductor wafer comprising:

forming the dielectric layer of the first thickness on the wafer;

positioning a shield layer formed of a dielectric antireflective coating (DARC) material that is different than the dielectric layer on the dielectric layer;

positioning a sacrificial layer on the shield layer;

forming an aperture in the sacrificial layer, shield layer, and dielectric layer;

depositing conductive material so as to fill the aperture and so as to be directly in contact with at least a portion of the sacrificial layer;

removing the conductive material and the sacrificial layer using a chemical mechanical polishing process that removes the conductive material and the sacrificial layer until the shield layer is reached, wherein the shield layer is more resistant to planarization by the chemical mechanical polishing process than the sacrificial layer, and wherein the shield layer inhibits thinning of the dielectric layer during the chemical mechanical polishing process, and wherein interposing the sacrificial layer between the conductive material and the shield layer reduces the amount of conductive material on the shield layer following the chemical mechanical polishing process; and detecting when the chemical mechanical polishing process has removed the sacrificial layer by detecting when the CMP process has reached the shield layer and halting the chemical mechanical polishing process upon detecting when the sacrificial layer has been removed and prior to the complete removal of the shield layer so as to maintain the dielectric layer at the first thickness.

2. The method of claim 1, wherein the shield layer is formed of a material having a different hardness than the sacrificial layer and wherein detecting when the chemical mechanical polishing process has removed the sacrificial layer comprises detecting the transition between when the chemical mechanical polishing process is interacting with the sacrificial layer and the shield layer.

3. The method of claim 2, wherein the step of detecting when the chemical mechanical polishing process has removed the sacrificial layer comprises sensing the current being drawn by a motor inducing relative movement between a polishing pad and the wafer and sensing when the current drawn by the motor indicates that the pad is in contact with the shield layer.

4. The method of claim 1, wherein the chemical mechanical polishing process is performed using an etchant selected to remove the sacrificial layer and wherein the shield layer is selected to be resistant to the selected etchant.

5. The method of claim 4, wherein the shield layer is comprised of a Nitride layer positioned on the dielectric layer.

6. The method of claim 5, wherein the sacrificial layer is comprised of a BPSG Oxide layer formed on the Nitride layer.

7. The method of claim 1, further comprising forming a cavity in the dielectric layer and wherein depositing the conductive material on the sacrificial layer results in the cavity being filled with the conductive material.

8. A method of forming a dielectric layer of a first thickness on a semiconductor wafer comprising:
   forming the dielectric layer of the first thickness on the wafer;
   positioning a shield layer formed of a dielectric anti-reflective coating (DARC) material that is different than the dielectric layer on the dielectric layer;
   positioning a sacrificial layer on the shield layer;
   forming an aperture in the sacrificial layer, shield layer, and dielectric layer;
   depositing conductive material so as to fill the aperture and so as to be directly in contact with at least a portion of the sacrificial layer;
   removing the conductive material and the sacrificial layer using a chemical mechanical polishing process that removes the conductive material and the sacrificial layer until the shield layer is reached, wherein the shield layer is more resistant to planarization by the chemical mechanical polishing process than the sacrificial layer, and wherein the shield layer inhibits thinning of the dielectric layer during the chemical mechanical polishing process, and wherein interposing the sacrificial layer between the conductive material and the shield layer reduces the amount of conductive material on the shield layer following the chemical mechanical polishing process;
   selecting an etchant for use with the chemical mechanical polishing process to facilitate removal of the sacrificial layer, and wherein the shield layer is selected to be resistant to the selected etchant; and
   detecting when the chemical mechanical polishing process has removed the sacrificial layer by detecting when the CMP process has reached the shield layer and halting the chemical mechanical polishing process upon detecting when the sacrificial layer has been removed and prior to the complete removal of the shield layer so as to maintain the dielectric layer at the first thickness.

9. The method of claim 8, wherein the shield layer is formed of a material having a different hardness than the sacrificial layer and wherein detecting when the chemical mechanical polishing process has removed the sacrificial layer comprises detecting the transition between when the chemical mechanical polishing process is interacting with the sacrificial layer and the shield layer.

10. The method of claim 9, wherein the step of detecting when the chemical mechanical polishing process has removed the sacrificial layer comprises sensing the current being drawn by a motor inducing relative movement between a polishing pad and the wafer and sensing when the current drawn by the motor indicates that the pad is in contact with the shield layer.

11. The method of claim 8, wherein the shield layer is comprised of a Nitride layer positioned on the dielectric layer.

12. The method of claim 11, wherein the sacrificial layer is comprised of a BPSG Oxide layer formed on the Nitride layer.

13. The method of claim 8, further comprising forming a cavity in the dielectric layer and wherein depositing the conductive material on the sacrificial layer results in the cavity being filled with the conductive material.

* * * * *